June 9, 1953 H. B. STOTT 2,641,704

HIGH-INDUCTANCE LOOP ANTENNA AND SYSTEM

Filed Aug. 3, 1950

INVENTOR
HAROLD B. STOTT
BY H. W. Newton
ATTORNEY

Patented June 9, 1953 2,641,704

UNITED STATES PATENT OFFICE 2,641,704

HIGH-INDUCTANCE LOOP ANTENNA AND SYSTEM

Harold B. Stott, Glenolden, Pa., assignor to Radio Corporation of America, a corporation of Delaware Application August 3, 1950, Serial No. 177,363

8 Claims. (Cl. 250—33.67)

This invention relates generally to signal selecting circuits for radio receivers. In particular it relates to high-inductance tunable loop antennas and systems.

Conventionally, a loop antenna for a broadcast receiver is tuned by a shunted variable capacitor. This type of capacitively tuned circuit, when used in connection with loop antennas known in the prior art, has certain disadvantages. Thus, in order to obtain a desired wide tuning range to cover the present broadcast band, for example, the tuning capacitor must have a large capacity value at the low frequency end of the tuning range. As a result, the total impedance of the tuned circuit at that frequency is low. This in turn reduces the sensitivity of the antenna circuit and the signal strength in the receiver at the low end of the tuning range. In addition, as the signal strength falls off, the signal-to-noise ratio becomes poor. Furthermore, the large capacity limits the inductance of the loop antenna, and the signal is accordingly smaller over the entire tuning range.

An object of this invention, therefore, is to provide an antenna system wherein a small capacitor may be used to tune a high-inductance antenna over the broadcast frequency range.

Many antenna circuits have been designed to overcome the decreased sensitivity at the low end of the tuning range. However, in most instances, further circuit components have been introduced, whereby further losses have caused the overall sensitivity of the loop antenna circuit to decrease. In addition, many of the resulting circuits have not been adaptable for use with high-inductance loop antennas, as is desirable. Since the signal pick-up is dependent upon the inductance of the antenna loop, the use of a low-inductance loop results in reduced sensitivity of the antenna circuit. Therefore, the use of a high-inductance loop is more generally desirable.

Not only should the inductance of the loop be high to secure maximum signal voltage pick-up, but the effective height ($h_e$) of the loop and the "Q" (defined as the ratio of reactance to resistance) should both also be high. The effective height is dependent to some extent upon the loop inductance and therefore may be increased by either actually or effectively enlarging the area bounded by the loop turns, or by increasing the number of turns. Both these expedients, however, in increasing the loop inductance have in the past made it more difficult to tune the loop over a desired wide frequency range due to the increased minimum capacity acquired.

Thus, it becomes more difficult to cover a wide tuning range if circuit improvements to provide additional inductance increases the fixed capacity in the antenna tuning circuit. Either a large tuning capacitor with a low inductance antenna or a small tuning capacitor with a high inductance antenna is necessary to provide tuning within the desired tuning range. The signal sensitivity is greatest with the high inductance and low capacity which results with a minimum of circuit components and contributes to higher effective "Q." In addition, further circuit losses are introduced when more circuit components are used and the resulting "Q" is lower. Therefore, it would be highly desirable, not only from the cost standpoint, but also from the performance standpoint, to eliminate circuit components thereby further improving antenna circuit operation.

To increase the effective height of a loop antenna, it is generally desirable in a broadcast receiver to enlarge the area bounded by the loop turns. However, the space within a small radio receiver is limited and for this reason an antenna must usually be restricted in size. One object of the invention therefore, is to effectively enlarge the area bounded by loop antenna turns and thereby provide a miniature antenna which occupies a minimum of space without sacrificing functional performance.

Systems in the prior art have used ferromagnetic cores to decrease space requirements and increase the antenna signal pick-up. They have not, however, as a rule, succeeded in providing optimum signal energy pick-up, since the minimum circuit capacity is in general high, and the resulting number of antenna turns at resonance is therefore limited to such an extent that the effective height is not greatly increased. It is therefore another object of the invention to provide a loop antenna system with very small minimum capacity and therefore having an improved signal energy pick-up.

As before mentioned, additional loading or tuning inductances, sometimes afforded in loop antenna circuits, also contribute resistive losses which greatly lower the antenna circuit "Q" to the further detriment of the signal voltage pick-up and signal transfer in the loop antenna system. It is desirable therefore, from this standpoint, to use a variable capacitor for tuning to provide a high circuit Q, since the resistive losses of a capacitor are generally negligible.

It is another object of the invention to provide a high-gain, high-Q, high-impedance tuned loop antenna system which functions in an improved manner, and which may be tuned by means of a capacitive impedance or tuning capacitor of relatively low maximum capacity value.

A further object of the invention is to provide an antenna tuning system which operates to provide increased signal voltage to a radio receiver system, or the like, with a fewer number of component parts.

A still further object of the invention is to provide an inexpensive antenna tuning means which has a tuning frequency range substantially broad enough to fully cover the broadcast frequency range of 530 to 1610 kilocycles with a high degree of efficiency.

In accordance with the invention there is provided a superheterodyne receiver system comprising a high inductance loop antenna and an associated signal transfer circuit. The loop antenna includes an elongated ferromagnetic core and coil windings spread over a small section of the length of the core near one end. Therefore, the antenna occupies a minimum of space and provides a good signal pick-up.

The construction and mode of operation of the invention together with further objects and advantages will become more apparent when considered in connection with the accompanying drawing, in which.

Figures 1, 2, 3:
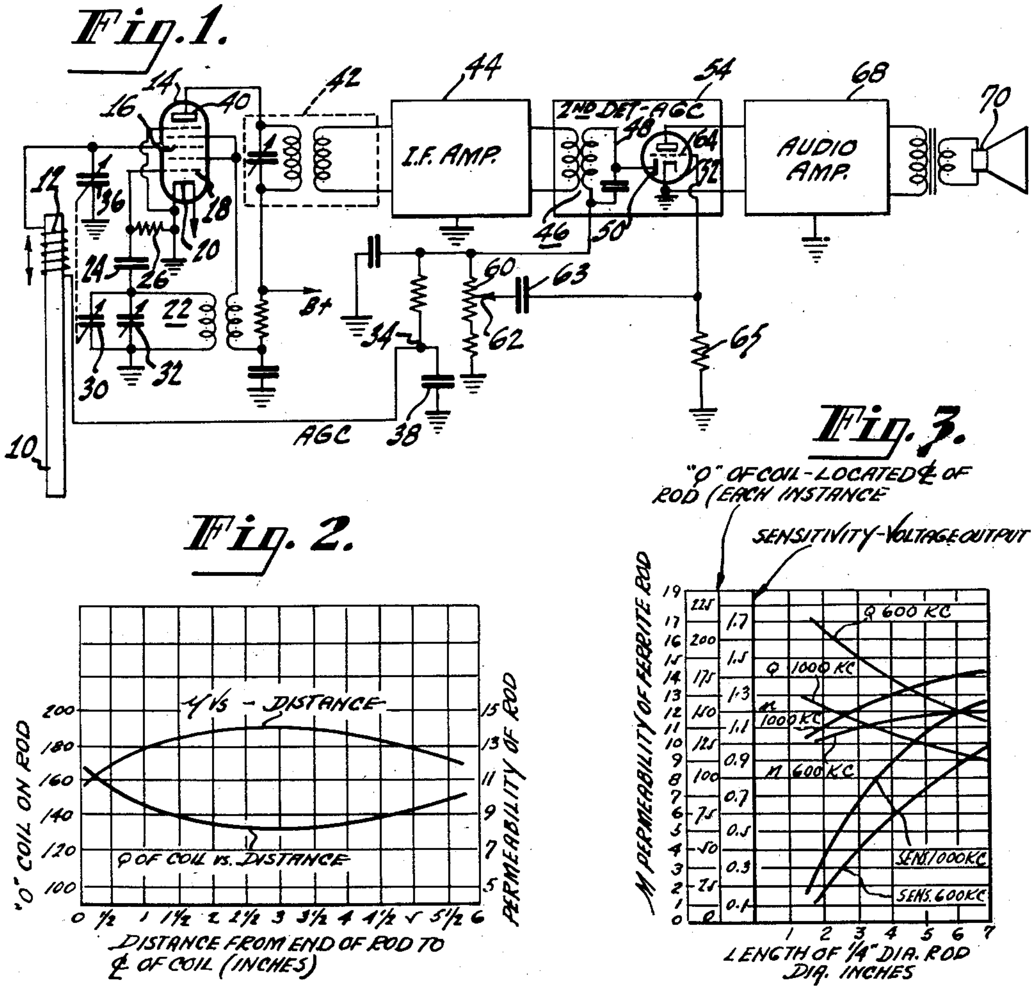
Figure 1 is a schematic circuit diagram of a radio signal receiving system embodying the invention.
Figure 2 is a graph showing the permeability ($\mu$) and merit factor (Q) plotted against the distance from the center line of a loop coil winding to the end of an elongated ferromagnetic rod, as constructed in accordance with the invention.
Figure 4:
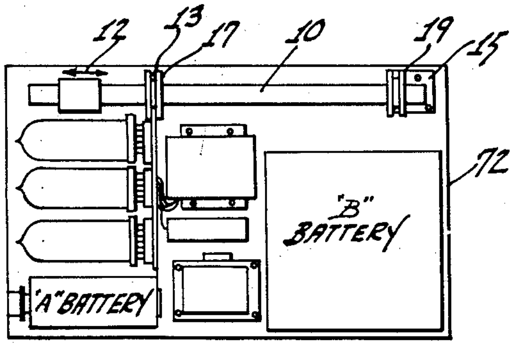

Figure 3 is a graph showing different characteristics of receivers embodying the invention when tuned near each end of the broadcast tuning range, as plotted against the length of a one-quarter inch diameter ferromagnetic antenna core or rod; and, Figure 4 is a rear, elevational view of a portable receiver including a loop antenna mounting within the receiver cabinet, in accordance with the invention.

In Figure 1 the receiver system includes a high inductance loop antenna comprising an elongated ferromagnetic rod or core 10 having a loop coil or winding 12 coaxially extending along a short section of the length of the core near one end. The material of which the core 10 is constructed is preferably a ferrite such as nickel zinc iron oxide, but may of course be of any ferromagnetic material and is not necessarily limited to that type of material well known in the art as a ferrite. It is noted that a ferrite core will provide a high Q and higher permeability antenna circuit than an ordinary ferric metal core. This is desirable, as will hereinafter be explained.

The coil 12 comprises the loop inductance which is wound in the form of a solenoid having a small diameter and mounted to provide a small amount of longitudinal movement upon the core 10 when desired, to thereby afford a tracking adjustment when the antenna is used in a tuned receiver input circuit. Thus the tracking adjustment is made by unitarily adjusting the coil windings to the proper place upon the core to obtain tracking between the tuned circuits at the low frequency end of the tuning range. For this purpose a small amount of movement is sufficient, and the coil may be fixed permanently to the rod by means of asphalt, sealing wax or some other binder material after the initial adjustment, if desired. As will be hereinafter explained in detail, a very small longitudinal movement of the coil upon the core varies the inductance within substantial limits.

A radio frequency signal pick-up circuit comprises a converter tube 14 having a pair of input electrodes 16 and 18, which in combination with the cathode 20 comprises two sets of input elements. An oscillator circuit 22 is connected through a coupling capacitor 24 to one of the input elements 18, which has a grid leak resistor 26 connected to the grounded cathode 20. The oscillator circuit is of the conventional type and need not herein be discussed with greater detail except that it is tuned by means of a variable oscillator tuning capacitor 30, and a small trimmer capacitor 32 connected in shunt with the main tuning capacitor 30 to provide a tracking adjustment at the high frequency end of the tuning range.

The antenna coil 12 is connected between the other input element 16 and ground by medium of an automatic gain control, (AGC) voltage terminal 34. A grounded antenna tuning capacitor 36 is commonly connected to the input element 16 and the antenna loop coil 12 thereby providing with the antenna a variably resonant radio frequency circuit for tuning over the broadcast frequency range. The other terminal of the antenna coil 12 is grounded for signal frequencies by the AGC by-pass capacitor 38 connected between the AGC voltage terminal 34 and ground. The antenna tuning capacitor 36 is interconnected for unicontrol operation with the variable oscillator capacitor 30 as indicated in the drawing by the dotted line. The circuit is in some respects the same as any conventional superheterodyne receiver and therefore need not be discussed in detail except for features of operation pertinent to the present invention.

As before mentioned, the antenna loop coil 12 may be variably adjusted upon the elongated rod 10 to provide tracking at the lower frequency end of the receiver tuning range. In this manner, inductance adjustment may be made without the addition of any additional components such as a trimmer capacitor ordinarily necessary in this type of circuit. By eliminating the trimmer capacitor adjustment a lower minimum capacity may be attained and therefore a higher antenna inductance. Accordingly a better signal pick-up is attained in accordance with this phase of the invention. The tracking adjustment at the high end of the frequency range is accomplished in a conventional manner by the trimmer capacitor 32 in the oscillator circuit.

An output utilization circuit for the multi-element converter device 14 is connected to the anode 40 by means of intermediate frequency (I.-F.) transformer 42. Further I.-F. amplifier stages as needed are connected to the transformer 42 as indicated by the I.-F. amplifier block diagram 44. The final I.-F. transformer 46 is shown schematically within the block 54. The high signal potential transformer lead 48 is connected to the anode 50 of a diode detector. The diode is shown as one section of a conventional dual purpose, diode-triode electronic tube 52 or some similar device in the second detector AGC circuit contained within block 54. A detected output signal is therefore derived across a variable resistor or potentiometer 60 serially connected to ground from the low signal potential terminal of the secondary winding of the final I.-F. output transformer 46.

From the variable tap 62 on the potentiometer 60 an output signal is coupled through a capacitor 63 to the grid 64 of the first audio amplifier tube comprising a triode section of the dual purpose tube 52. The grid is connected to ground by a grid leak resistor 65. It is to be recognized that the invention is not limited to the particular tubes shown, since any suitable translating device may be adapted for operation in the present system. It is therefore clear that the described embodiments are for purposes of illustration and not limitation.

A suitable audio amplifier system 68 may then be connected between the output elements of the triode amplifier portion of tube 52 and a speaker 70 or any other suitable utilization or loading means. The illustrated schematic diagram of Figure 1 therefore embodies the high inductance loop antenna of the present invention and associated circuits which in combination with the antenna provide improved functional performance. The type circuits shown in block diagram are well known in the art and may be of conventional design.

Some of the improved functional advantages of the invention may be illustrated by consideration of the graph shown in Figure 2. The upper curve, as shown on the graph, signifies the relationship of permeability of the rod as plotted against the distance of the center line of the antenna coil 12 from the end of the rod. It is noted that the permeability becomes smaller as the coil is moved nearer the end. This is important because a lower permeability near the end of the rod allows the antenna coil 12 to include more windings and therefore effectively to have a greater loop area. The effective height of the loop antenna is therefore increased and a greater signal pick-up is effected.

As explained hereinbefore, one of the objects of the invention is to provide a high inductance loop. Since no trimming capacitor is provided for adjustment of the tracking at the low end of the frequency range with the present antenna system, the input circuit shunt capacity is decreased and therefore the inductance of the loop may be further increased as before explained. The multi-element converter tube further affords very little capacity between the antenna or signal input electrode 16 and ground so that essentially the only limiting factor, with respect to the antenna coil inductance, is the size of tuning capacitor 36 needed to tune the input circuit to resonance over the required tuning range. Therefore the described loop antenna in combination with the discussed input circuit provides a circuit having a high signal pick-up which results in greater receiver sensitivity and a good signal to noise ratio.

Likewise, it may be noted that the merit factor "Q" of the coil is higher as the center line of the antenna coil is placed nearer the end of the rod. This factor not only contributes to an even higher signal-to-noise ratio, but is also desirable in increasing the effective height of the antenna, and in providing a better rejection of signals at image or other unwanted frequencies in the tuned input circuit. Therefore, by providing a long rod 10 of ferromagnetic material and placing the coil near the end of the rod, the unexpected results of improving the signal-to-noise ratio, providing increased receiver sensitivity, and decreasing the number of receiver component parts, are achieved.

As made clear in the graph of Figure 3 there are rods of certain proportions which provide the best operating advantages. Thus, as shown in the curves, a rod one quarter inch in diameter and of about seven inches in length at present appears to provide the best combination of high receiver sensitivity, high permeability and high Q near both the low and high frequency portions of the broadcast tuning range. It is noted that the rod used to afford the characteristics shown in the graph of Figure 2, also was seven inches in length and one quarter inch in diameter.

As seen from the permeability curve in Figure 2, when the center line of the coil is about one inch from the end of the rod a small longitudinal motion of the coil results in a large change of permeability. Thus it is found that a plus or minus one quarter inch motion provided a ten per cent change in the inductance of the antenna loop. The antenna used to provide the inductance change comprises a coil having a progressive universal winding of approximately 104 turns and having a length of five eighths inches. The length of the one quarter inch diameter rod was seven inches.

It was found that the 28 to 1 ratio of length to diameter above used was of the proper order to give the best overall antenna operation. However, a ratio of length to diameter from about 16 to 50 includes the useful and optimum proportions of the rod from the performance standpoint. The approximate Q of the ferrite rod antenna used was about 140 at 1150 kilocycles and about 200 at 600 kilocycles. The inductance of the coil was approximately 550 micro-henries, and the permeability of the rod was approximately 13 with the coil center line at approximately one inch from one end of the rod. Further improvements in the art of ferrite manufacture has made it possible to increase the above "Q" and permeability figures nearly 50 per cent.

As shown in Fig. 3 the sensitivity increases with rod length. It should be pointed out that the ferrite rod itself has flux gathering properties. The flux from the propagated radio wave approaching the rod is attracted by the low reluctance, high permeability of the rod mass. Actually the rod gathers flux from the higher reluctance air space around the rod. Thus, the rod guides much more of the flux to cut the loop winding than would be possible without the rod. The higher the permeability of the rod, the better the flux gathering properties. However, a compromise must be reached in maintaining the requisite number of coil turns necessary for proper circuit operation.

As compared in size with standard loop antennas the present miniature high-inductance loop antenna is considerably smaller and therefore may easily be adapted to a small portable receiver 72 or the like as shown in Figure 4. The coil 12 and the rod 10 comprise the high inductance loop antenna which is shown mounted by means of brackets 13 and 15 with associated grommets 17 and 19. The brackets 13 and 15 are preferably of a non-ferrite material so that a magnetic loop may not be completed through the rod 10 by means of the receiver chassis or case. Should an aluminum chassis, or the like, be used the brackets may be merely extensions of the chassis itself.

As shown in the diagram the antenna loop coil or winding may be mounted much closer to the receiver components than a conventional loop antenna coil. This not only provides for convenience in the location of parts such as will allow shorter connecting leads and therefore better performance at higher frequencies, but it also allows the overall size of the entire system to be kept small, as is desirable in most instances.

It is to be recognized from the foregoing description that in accordance with the invention, there may be provided an improved high-inductance loop antenna comprising an elongated ferromagnetic core having one end inserted within the loop antenna coil, thus being asymmetrically mounted with respect to the coil whereby a substantial proportion of its length extends outwardly from the loop. This antenna, in combination with a superheterodyne receiver adapted for the reception of electronic signals in the broadcast frequency range, provides improved performance, including higher receiver sensitivity and a better signal-to-noise ratio. It is to be recognized that although there is described a specific embodiment of the invention, that the scope of the invention is not intended to be limited thereby. Thus, the improved loop antenna may be used in other circuits with some of the foregoing advantages. Therefore, there may be suggested to those skilled in the art certain modifications which will not necessarily depart from the spirit or scope of the invention as defined by the appended claims.

What is claimed is:

1. A miniature high-inductance loop antenna for reception of electromagnetic waves comprising in combination, an elongated ferromagnetic core having a relative ratio of length to diameter of substantially no less than 16 to 1 and no more than 50 to 1, and antenna coil windings spread over a small section of the length of said core at substantially one end thereof, whereby the antenna occupies a minimum of spaces without sacrificing functional performance.

2. A loop antenna as defined in claim 1 wherein the core comprises a ferrite rod and wherein the center-line of the coil windings is located substantially one-seventh of the rod length from the end of the rod.

3. A loop antenna as defined in claim 1 wherein the coil windings are unitarily movable over a small section of the length of the core at said one end, whereby the inductance of said windings may be varied within substantial limits to provide initial tuning adjustment of the loop antenna.

4. In a loop antenna system for reception of signals in the radio broadcast frequency range, an elongated ferromagnetic core member having a relative ratio of length to diameter of substantially no less than 16 to 1 and no more than 50 to 1, antenna coil windings coaxially extending along a short section of the length of said core at substantially one end thereof, thereby forming a high inductance loop antenna for the reception of electromagnetic waves, and a tuning capacitor connected in shunt with said coil windings, said capacitor having a relatively low maximum tuning capacity in combination with the high inductance of said coil winding to provide a resonant circuit for tuning fully over said broadcast frequency range with a high degree of efficiency.

5. In a loop antenna circuit, an antenna loop coil, a ferromagnetic core member asymmetrically mounted with respect to said loop coil and having a relative ratio of length to diameter of substantially no less than 16 to 1 and no more than 50 to 1, and means for moving said loop coil unitarily over a small section of said core at substantially one end thereof to initially variably adjust the inductance of the loop.

6. The combination as defined in claim 5 wherein the loop coil is a short winding having an inside diameter of approximately one quarter of an inch, and the core member is an elongated rod of a diameter to fit within the coil and adapted for insertion therein.

7. The combination as defined in claim 5 wherein the core member is an elongated rod and the coil extends coaxially along a short section of the length of the rod and is located substantially one-seventh of the rod length from the end of the rod.

8. The combination as defined in claim 5 wherein the core member is an elongated ferrite rod.

HAROLD B. STOTT.

References Cited in the file of this patent

UNITED STATES PATENTS

| Number | Name | Date |
|---|---|---|
| 2,257,250 | Travis | Sept. 30, 1941 |
| 2,313,231 | Forbes | Mar. 9, 1943 |
| 2,316,623 | Roberts | Apr. 13, 1943 |
| 2,335,969 | Schaper | Dec. 7, 1943 |
| 2,350,211 | Bergtold | May 30, 1944 |
| 2,469,168 | Loughlin | May 3, 1949 |